United States Patent [19]
Levy

[11] Patent Number: 5,380,952
[45] Date of Patent: Jan. 10, 1995

[54] INTEGRATED CIRCUIT PACKAGE WITH STABILIZER BAR

[75] Inventor: Paul S. Levy, Chandler, Ariz.

[73] Assignee: VLSI Technology, Inc., San Jose, Calif.

[21] Appl. No.: 157,963

[22] Filed: Nov. 24, 1993

Related U.S. Application Data

[63] Continuation of Ser. No. 918,297, Jul. 22, 1992, abandoned.

[51] Int. Cl.⁶ ............................................. H01L 23/02
[52] U.S. Cl. ..................................... 174/52.4; 29/827
[58] Field of Search ........................ 174/52.1, 52.4; 437/206, 207, 209, 211, 215, 217, 219, 220; 29/846, 854, 855, 856, 884, 827

[56] References Cited

U.S. PATENT DOCUMENTS

| | | | |
|---|---|---|---|
| 4,482,781 | 1/1984 | Burns | 174/52.4 |
| 4,701,781 | 10/1987 | Sankhagowit | 174/52.4 X |
| 4,747,017 | 5/1988 | Koors et al. | 361/395 |
| 4,756,080 | 7/1988 | Thorp, Jr. et al. | 29/827 |
| 4,796,078 | 1/1989 | Phelps, Jr. et al. | 174/52.4 X |
| 4,796,080 | 1/1989 | Phy | 174/52.4 X |
| 4,801,561 | 1/1989 | Sankhagowit | 437/207 |
| 5,034,568 | 7/1991 | Mather | 174/52.4 |
| 5,065,504 | 11/1991 | Olla | 29/827 |
| 5,138,115 | 8/1992 | Lam | 174/52.4 |
| 5,160,810 | 11/1992 | Rohde et al. | 174/52.4 |

*Primary Examiner*—Leo P. Picard
*Assistant Examiner*—Christopher Horgan
*Attorney, Agent, or Firm*—LaValle D. Ptak

[57] ABSTRACT

A stabilizer bar made of non-conductive material (such as a poly enid plastic) is secured to the top side of extended leads on each side of a flat high density integrated circuit package. The bar is located intermediate the length of the leads, and is used as a lead form during a subsequent forming operation. The leads are formed around the stabilizer bar, which remains in place throughout the forming operation and during subsequent mounting of the integrated circuit package.

10 Claims, 2 Drawing Sheets

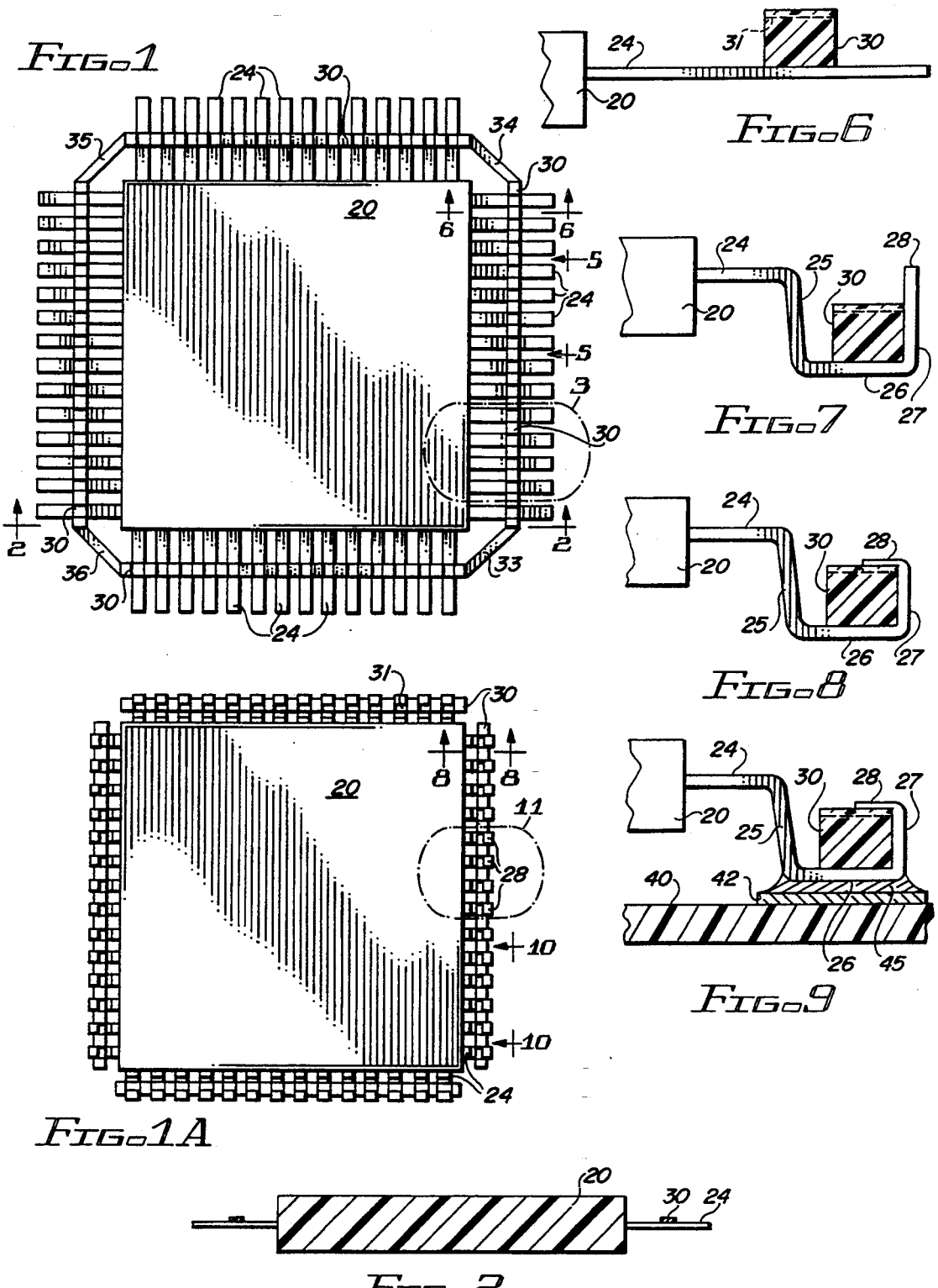

INTEGRATED CIRCUIT PACKAGE WITH STABILIZER BAR

This is a continuation, of application Ser. No. 07/918,297, filed Jul. 22, 1992, abandoned.

BACKGROUND

High density integrated circuit packages, known as flat packs or formed packages for surface mounting, are widely used in many applications. Typically, such packages have a relatively large number of parallel leads extending from each of the four sides of a rectangular package. It is important for the leads to be properly spaced from one another, and to remain co-planar at the time the packages are attached to printed circuit boards.

Standard manufacturing techniques for high density surface-mounted flat packages typically utilize the formation of plastic tie bars around the ends of the leads, or attached to the bottom side of the ends of the leads during manufacture of the packages. This is done to prevent misalignment of the leads or subsequent damage during handling of the package prior to forming or configuring the leads to the shape required for attachment of the package to a printed circuit board. These tie bars are severed from the leads at the forming stage of operation; so that once the leads are formed, the formed leads are physically independent of one another. The result is a relatively high susceptability to bending or misalignment of the leads during handling of the formed package prior to its attachment to a printed circuit board. Because the leads are physically independent of one another, mishandling of the package prior to its connection to a printed circuit board can cause one or more of the leads to be bent so as not to be co-planar with the rest of the leads. This results in subsequent attachment difficulties to printed circuit boards.

It is desirable to provide a structure which will significantly reduce the co-planarity and bent lead failures resulting from the mishandling of formed high density integrated circuit packages prior to attachment of such packages to a printed circuit board.

SUMMARY OF THE INVENTION

It is an object of this invention to provide an improved integrated circuit package.

It is an additional object of this invention to provide improved stabilization of the leads of an integrated circuit package.

It is another object of this invention to reduce co-planarity bent lead failures of the leads of an integrated circuit package.

It is a further object of this invention to provide a stabilizer bar across the extended leads of an integrated circuit package, in which the stabilizer bar also functions as a lead form for the leads, which remains in place at all times, including after attachment of the integrated circuit package to a printed circuit board.

In accordance with a preferred embodiment of the invention, a high density integrated circuit package, which has a plurality of leads extending out of the side of the package, is provided with a stabilizer bar. The stabilizer bar is in the form of an elongated bar of non-conductive material, which is attached to the top side of the leads and is spaced from the side of the integrated circuit package, from which the leads extend. The location of the bar is intermediate the length of the leads; and it remains in place during subsequent lead forming and mounting of the integrated circuit package.

BRIEF DESCRIPTION OF THE DRAWINGS

FIG. 1 is a top view of a preferred embodiment of the invention in an intermediate stage of manufacture;

FIG. 1A is a top view of the embodiment of FIG. 1 in a completed stage of manufacture;

FIG. 2 is a cross-sectional view taken along the line 2—2 of FIG. 1;

FIG. 6 is an enlarged cross-sectional view taken along the line 6—6 of FIG. 1;

FIG. 7 is an enlarged cross-sectional view of the parts shown in FIG. 6 at a first stage of formation;

FIG. 8 is a cross-sectional view of the portion shown in FIG. 7 at a final stage of formation and taken along the line 8—8 of FIG. 1A;

FIG. 9 illustrates the manner of attachment of the device of FIG. 1A to a printed circuit board;

DETAILED DESCRIPTION

Reference now should be made to the drawings, in which the same reference numbers are used throughout the different Figures to designate the same components.

FIG. 1 is a top view of a high density integrated circuit flat package 20 modified in accordance with a preferred embodiment of the invention. The package 20 comprises a square potted integrated circuit with a group of fourteen parallel leads 24 extending outwardly from each side of the package, and perpendicular to each side. Each of the four groups of leads 24 are flat; and all of the leads 24 are located in the same plane, parallel to the top and bottom faces of the package 20, as shown most clearly in FIG. 2.

The package 20 and leads 24, described thus far, are standard. To the standard package, however, four narrow elongated bars (preferably formed of a poly enid plastic) are bonded on top of each of the four groups of leads 24, as shown most clearly in FIG. 1. The bars 30 are parallel to the respective sides of the integrated circuit package 20; so that they each are perpendicular to the groups of leads 24 across which they are located, and to which they are attached. The ends of the bars 30 on each of the four sides are interconnected by four plastic struts 33, 34, 35 and 36, as shown in FIG. 1.

The bars 30 and the struts 33 through 36 may be bonded to the leads 24 by heat bonding or with any suitable adhesive. It is important that the material for the bars 30 is selected to withstand the subsequent processing operation used to form the leads, and have sufficient temperature stability to withstand the soldering temperatures which result upon subsequent attachment or mounting of the package to a printed circuit board. Obviously, the bars 30 also must be made of non-conductive material; and they are located approximately half-way between the sides of the package 20 and the ends of the respective groups of leads 24 to which they are attached.

Figure 3:
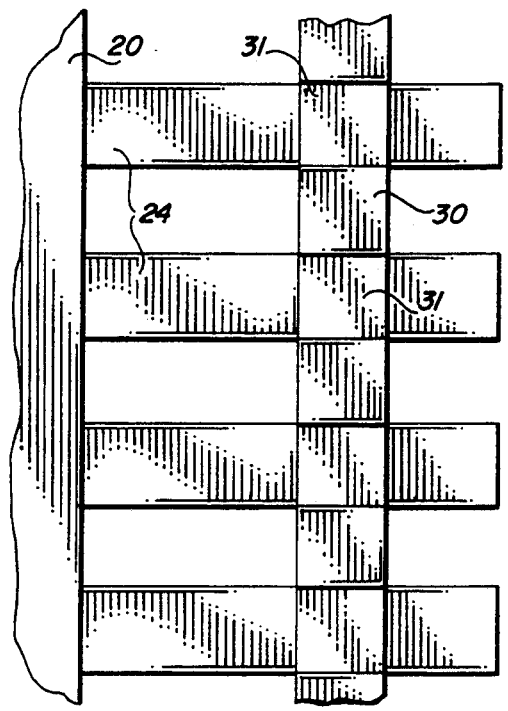
FIG. 3 is a top view of the portion encircled in FIG. 1.
Figure 4:
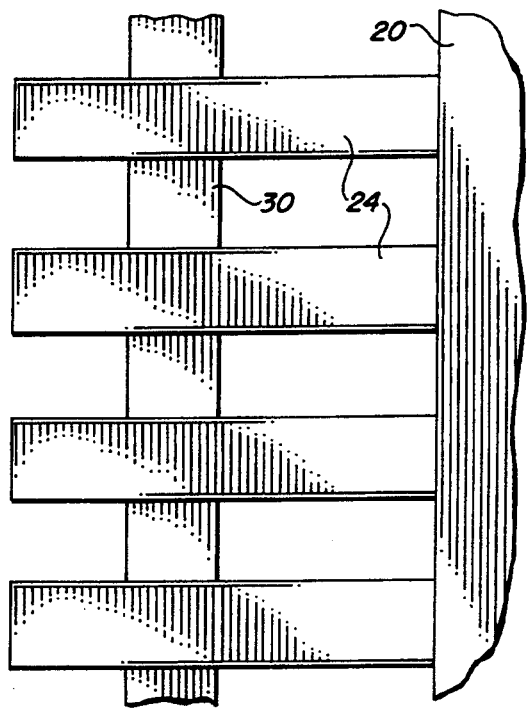
FIG. 4 is a bottom view of the same portion shown in FIG. 3.
Figure 5:
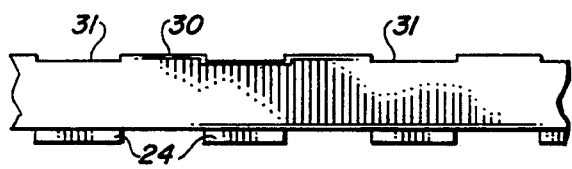
FIG. 5 is an enlarged end view taken of the portion between the lines 5—5 of FIG. 1.

As shown most clearly in FIGS. 3 and 5, the tops of each of the bars 30 have shallow grooves or slots 31 formed in them. The slots 31 are positioned directly over the leads 24 attached to the underside of the stabilizer bars 30, and have a width which is equal to the width of the leads 24 extending out of each side of the package 20.

As is well known, surface mounted packages of the type shown in FIG. 1 subsequently undergo a lead forming operation, which bends the leads downwardly and into a form presenting a flat surface suitable for connection to an integrated circuit board. During the forming operation, the struts 33, 34, 35 and 36 are severed, typically in the first forming step.

Reference should be made to FIGS. 6 through 8, which illustrate the different forming steps performed. FIG. 6 is an enlarged cross-sectional view of one of the leads 24 extending out of the side of the package 20, showing the position of the stabilizer bar 30 on top of the lead. FIG. 7 illustrates the configuration which is assumed by each of the leads 24 of a set for the first forming step. In FIG. 7, all of the leads 24 on each side of the package 20 are stamped downwardly into the configuration illustrated. The stabilizer bar 30 remains attached to the leads 24 to maintain alignment of the leads. Also, it can be seen that the bar 30 also functions as a lead form where the upper end of the lead 27 is bent vertically upward around the outside edge of the stabilizer bar 30. The portion of the lead 24 located on the opposite side of the stabilizer bar 30 is bent downwardly at a steep slope 25, with a flat bottom portion 26 extending between the near vertical portion 25 and the vertical portion 27.

Figure 10:
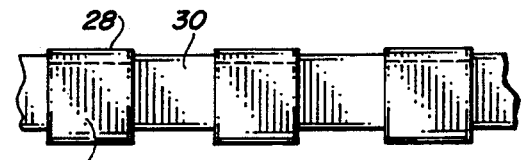
FIG. 10 is an enlarged end view taken between the lines 10—10 of FIG. 1A.
Figure 11:
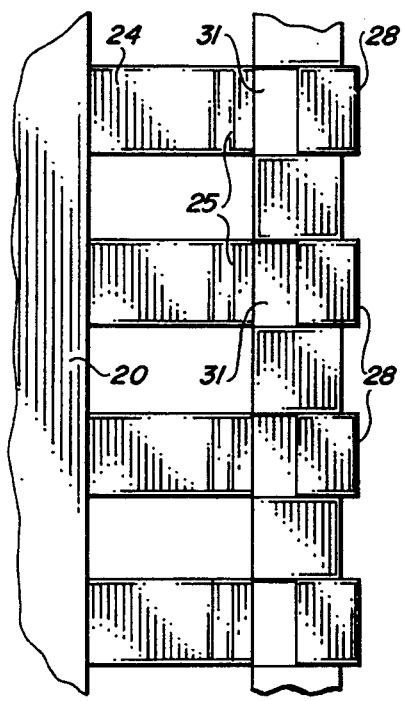
FIG. 11 is an enlarged top view of the portion encircled in FIG. 1A.

FIG. 8 illustrates the next step in the lead forming operation, where the tip 28 of the lead 27 is bent inwardly into the corresponding groove 31 on the top of the stabilizer bar 30, as illustrated in FIG. 8 and in the top view of FIG. 11. This is the finished or formed package, which is illustrated in FIG. 1A, and the parts of which are shown in FIGS. 8, 10 and 11.

FIG. 9 shows the manner of attachment of the formed package to a printed circuit board 40. The printed circuit board 40 typically has electrical connection pads 42 located on it; and a suitable solder 45 is used to secure the bottom portions 26 of each of the formed leads to the bonding pads 42 in a conventional manner.

It is readily apparent from an examination of FIG. 9 that the stabilizer bars 30 remain in place at all times, including the final attachment of the formed integrated circuit package to a printed circuit board 40. Since the stabilizer bars 30 remain attached, a planar reference for the contact area of the formed leads is provided; and the chance of bent lead co-planarity deviations, due to mishandling of the completed formed package shown in FIG. 1A, is significantly reduced.

The foregoing description of the preferred embodiment of the invention is to be considered as illustrative, and not as limiting. Clearly, the relative dimensions of the different parts can be modified without departing from the scope of the invention. Although a square integrated circuit package with a fixed number of leads on each side of it has been shown, other package configurations, with different numbers of leads, also may be used if desired. Also, the specific pattern of formation of the leads, which is shown, may be varied to comply with different requirements. Various other changes and modifications will occur to those skilled in the art, without departing from the true scope of the invention as defined in the appended claims.

I claim:

1. In a high density integrated circuit package having a plurality of leads extending out of at least one side of the package, an improvement including in combination:
an elongated rigid non-conductive stabilizer bar with depressed grooves in the top surface thereof and spaced from said one side of the integrated circuit package and attached to the top sides of said leads and across said leads intermediate the length thereof outside the integrated circuit package, with said depressed grooves in the top surface of said stabilizer bar being in alignment with each of the leads of said plurality of leads, said stabilizer bar maintaining co-planarity of said leads, wherein said leads are formed around said stabilizer bar with the ends of said leads located in said grooves.

2. The combination according to claim 1 wherein said non-conductive stabilizer bar has a width which is substantially less than the length thereof.

3. The combination according to claim 2 wherein said stabilizer bar is used as a lead form, with said leads being bent around at least some of the surfaces of said stabilizer bar.

4. The combination according to claim 3 wherein the side of said package is straight and said stabilizer bar is aligned parallel to the side of the package.

5. The combination according to claim 4 wherein said stabilizer bar is made of a poly enid plastic.

6. The combination according to claim 1 wherein the high density integrated circuit package is a flat package with a plurality of leads extending parallel to one another out of each side of said package, with separate identical elongated rigid non-conductive stabilizer bars attached to the top sides of the leads on each side of said package.

7. The combination according to claim 6 wherein the side of said package is straight and said stabilizer bar is aligned parallel to the side of the package.

8. The combination according to claim 7 wherein said non-conductive stabilizer bar has a width which is substantially less than the length thereof.

9. The combination according to claim 8 wherein said stabilizer bar is used as a lead form, with said leads being bent around at least some of the surfaces of said stabilizer bar.

10. The combination according to claim 9 wherein said stabilizer bar is made of a poly enid plastic.

* * * * *